United States Patent [19]

Abramovici et al.

[11] Patent Number: 5,566,187
[45] Date of Patent: Oct. 15, 1996

[54] METHOD FOR IDENTIFYING UNTESTABLE FAULTS IN LOGIC CIRCUITS

[75] Inventors: Miron Abramovici, Murray Hill; Mahesh A. Iyer, Cranbury, both of N.J.

[73] Assignee: Lucent Technologies Inc., Murray Hill, N.J.

[21] Appl. No.: 306,088

[22] Filed: Sep. 14, 1994

[51] Int. Cl.$^6$ ............................ G01R 31/28; G06F 11/00
[52] U.S. Cl. ....................... 371/22.1; 371/27; 395/183.01
[58] Field of Search .............................. 371/27, 23, 22.1; 324/73 R; 364/489, 580; 395/183.01

[56] References Cited

U.S. PATENT DOCUMENTS

| | | | |
|---|---|---|---|
| 4,716,564 | 12/1987 | Hung et al. | 371/27 |
| 4,862,399 | 8/1989 | Freeman | 364/580 |
| 5,331,570 | 7/1994 | Bershteyn | 364/489 |
| 5,410,552 | 4/1995 | Hosokawa | 371/27 |

OTHER PUBLICATIONS

IEEE Publication; "An Efficient Self–Learning Test Pattern Generation Algorithm for Sequential Circuits; Michael H. Schulz, Elisabeth Auth".

IEEE Publication; "An Interactive Sequential Test Pattern Generation System"; Rahul Razdan et al.

Friedman, A. D., "Fault Detection in Redundant Circuits," *IEEE Trans. on Electronic Computers*, vol. EC–16, pp. 99–100, Feb. 1967.

Abramovici, M. and M. A. Iyer, "One–Pass Redundancy Identification and Removal," *Proc. Intn'l Test Conf.*, pp. 807–815, Sep. 1992.

Harihara, M. and P. R. Menon, "Identification of Undetectable Faults in Combinational Circuits," *Proc. Intn'l Conf. on Computer Design*, pp. 290–293, Oct. 1989.

Menon, P. R. and H. Ahuja, "Redundancy Removal and Simplification of Combinational Circuits," *Digest of Papers, IEEE VLSI Test Symposium*, pp. 268–273, Apr. 1992.

Giraldi, J. and M. L. Bushnell, "Search State Equivalence for Redundancy Identification and Test Generation," *Proc. Intn'l Test Conf.*, pp. 184–193, Oct. 1991.

Abramovici, M., J. J. Kulikowski and R. K. Roy, "The Best Flip–Flops to Scan," *Proc. Intn'l Test Conference*, pp. 166–173, Oct. 1991.

Brglez, F., D. Bryan, and K. Kozminski, "Combinational Profiles of Sequential Benchmark Circuits," *Proc. 1989 Intn'l Symposium on Circuits and Systems*, pp. 1929–1934, May 1989.

Abramovici, M., J. J. Kulikowski, P. R. Menon, and D. T. Miller, "Smart and Fast: Test Generation for VLSI Scan–Design Circuits," *IEEE Design and Test of Computers*, pp. 43–54, Aug. 1986.

Abramovici, M., D. T. Miller, and R. K. Roy, "Dynamic Redundancy Identification in Automatic Test Generation," *IEEE Trans. on CAD*, pp. 404–407, Mar. 1992.

Chakradhar, S. T., V. D. Agrawal, and S. G. Rothweiler, "A Transitive Closure Algorithm for Test Generation," *IEEE Trans. on CAD*, Jul. 1993.

Kunz, W. and D. K. Pradhan, "Recursive Learning: An Attractive Alternative to the Decision Tree for Test Generation in Digital Circuits," *Proc. Intn'l Test Conf.*, pp. 816–825, Sep. 1992.

Agrawal, V. D. and S. T. Chakradhar, "Combinational ATPG Theorems for Identifying Untestable Faults in Sequential Circuits," *Proc. European Test Conf.*, pp. 249–253, Apr. 1993.

Abramovici, M. and M. A. Breuer, "On Redundancy and Fault Detection in Sequential Circuits," *IEEE Trans. on Computers*, vol. C–28, pp. 864–865, Nov. 1979.

Davidson, S., "Is $I_{DDQ}$ Yield Loss Inevitable:" *Proc. Intn'l Test Conf.*, Oct. 1994, pp. 572–579.

Cheng, K. T., "On Removing Redundancy in Sequential Circuits," *Proc. 28th Design Automation Conf.*, pp. 164–169, Jun., 1991.

Cheng, K. T., "An ATPG–Based Approach to Sequential Logic Optimization," *Proc. Intn'l. Conf. on Computer Aided Design*, pp. 372–375, 1991.

Cho, H., G. D. Hachtel and F. Somenzi, "Redundancy Identification/Removal and Test Generation for Sequential Circuits Using Implicit State Enumeration," *IEEE Trans. on CAD*, vol. 12, No. 7, pp. 935–945, Jul. 1993.

Moondanos, J. and J. A. Abraham, "Sequential Redundancy Identification Using Verification Techniques," *Proc. Intn'l Test Conf.*, pp. 197–205, Sep. 1992.

Iyer, M. A. and M. Abramovici, "Low–Cost Redundancy Identification for Combinational Circuits," *Proc. 7th Intn'l Conf. on VLSI Design, India*, pp. 315–318, Jan. 1994.

Pomeranz, I. and S. M. Reddy, "The Multiple Observation Time Test Strategy," *IEEE Trans. on Computers*, vol. 41, No. 5, pp. 627–637. May 1992.

Pomeranz, I. and S. M. Reddy, "Classification of Faults in Synchronous Sequential Circuits," *IEEE Trans. on Computers*, vol. 42, No. 9, Sep. 1993, pp. 1066–1077.

Pomeranz, I. and S. M. Reddy, "On Identifying Undectable and Redundant Faults in Synchronous Sequential Circuits," *12th IEEE VLSI Test Symposium*, pp. 8–14, Apr. 1994.

Ibarra, O. H. and S. K. Sahni, "Polynomially Complete Fault Detection Problems," *IEEE Trans. on Computers*, vol. C–24, pp. 242–249, Mar. 1975.

Chakraborty, T. J., S. Davidson, and B. Bencivenga, "The Architecture of the GenTest Sequential Circuit Test Generator," *Proc. IEEE Custom Integrated Circuits Conference*, May 1991, pp. 17.1.1–17.1.4.

Iyer, M. A. and M. Abramovici, "Sequentially Untestable Faults Identified Without Search," *International Test Conference* (ITC 1994), Oct. 1, 1994.

*Primary Examiner*—Robert W. Beausoliel, Jr.
*Assistant Examiner*—Nadeem Iqbal
*Attorney, Agent, or Firm*—Kenneth M. Brown

[57] ABSTRACT

A method of identifying untestable faults in a logic circuit. A lead in the circuit is selected and the circuit is analyzed to determine which faults would be untestable if the selected circuit lead were unable to assume a logic 0 and which faults would be untestable if the selected circuit lead were unable to assume a logic 1. Faults that would be untestable in both (hypothetical) cases are identified as untestable faults. Faults which would be untestable if the selected lead were unable to assume a given value may be determined based on an implication procedure. The implication procedure comprises the forward propagation of uncontrollability indicators and the backward propagation of unobservability indicators. An uncontrollability indicator for the given value is assigned to the selected circuit lead and propagated forward through the circuit according to a set of well-defined propagation rules. In addition, unobservability indicators are generated in the circuit based on the propagation of uncontrollability indicators. These unobservability indicators are then propagated backward through the circuit. The (hypothetically) untestable faults are then determined based on the resultant indicators and their corresponding circuit leads. Untestable faults may be identified in a sequential circuit by generating an equivalent combinational iterative array circuit model for a fixed number of time frames. Faults that would be untestable in both (hypothetical) cases and which are located in the last (i.e., latest-in-time) time frame are identified as untestable faults.

26 Claims, 7 Drawing Sheets

METHOD FOR IDENTIFYING UNTESTABLE FAULTS IN LOGIC CIRCUITS

CROSS-REFERENCE TO RELATED APPLICATION

The subject matter of this application is related to that of application Ser. No. 08/366,075, filed Dec. 29, 1994.

FIELD OF THE INVENTION

The present invention relates generally to the field of automatic test generation (ATG) for digital logic circuits and more particularly to the identification of untestable faults in such circuits.

BACKGROUND OF THE INVENTION

The problem of adequately testing digital logic circuits has grown substantially more complex over the years with the rapid increase in the complexity of the logic circuits being designed and fabricated. Most modem approaches to this problem involve the use of automatic test generation (ATG) systems which are charged with the task of automatically generating a comprehensive test plan for a given circuit design. Such an ATG system is provided with a description of the circuit design, typically in terms of its constituent circuit elements (e.g., logic gates) and the interconnections among those elements and to the circuit's primary inputs and primary outputs. The ATG system then automatically generates circuit stimuli which, when applied to the primary inputs of a fabricated instance of the given circuit design, will result in a response at the circuit's primary outputs which will identify (with a reasonable degree of certainty) whether the fabricated circuit is operating in accordance with the given circuit design.

Since the number of possible malfunctions which a fabricated circuit may theoretically exhibit is extremely large, ATG systems typically perform their task (and measure the quality of their result) based on a fault "model" in which only a comparatively small number of possible malfunctions are considered. The most common such model, the "stuck-at" fault model, enumerates the set of malfunctions in which each circuit lead (i.e., each input to and each output from a circuit element) may be individually "stuck" at one of its possible values (e.g., logic 0 or Logic 1). In this manner, the number of possible circuit faults to be considered is limited to twice the number of circuit leads. The "stuck-at" fault model has become well accepted as providing a reasonable correspondence to the set of likely physical errors which typically result from the fabrication process.

Most ATG systems select one of the modelled faults at a time, and attempt to generate tests (i.e., circuit stimuli) which will be able to "detect" that fault. That is, the system's goal is to find circuit stimuli which, when applied to the primary inputs of a "defective" circuit (i.e., one which has the given fault), will result in a response at the circuit's primary outputs which differs from that of a properly operational circuit. Usually, these circuit stimuli are generated as a result of an exhaustive search procedure involving substantial trial and error. For most typical circuit designs, however, quite a few of the faults may, if actually present in a fabricated instance of the circuit, cause no discernable change in the circuit behavior at all. These faults are, therefore, undetectable or untestable. (In fact, they usually reflect an inherent logic redundancy in the circuit design.) Thus, absent some means of identifying untestable faults, most ATG systems will identity such faults as untestable only after exhausting the search space being examined. Therefore, a large portion of an ATG system's time (if not most of it) may be spent in futile attempts to generate tests for untestable faults.

Although prior art techniques which eliminate some untestable faults have been used, these techniques typically eliminate only a small portion of all untestable faults. In particular, a conventional circuit lead "controllability" and "observability" analysis may be performed to identify circuit leads which either cannot be set to a given logic value (i.e., are uncontrollable to that value), or whose value cannot be observed at the circuit's primary outputs. As a result of such an analysis, a limited number of untestable faults can be identified. However, the identification of the vast majority of untestable faults is not so simple. Most untestable faults occur due to more complex circuit redundancies in which all of the relevant circuit leads are individually controllable to both logic values and are also observable at the circuit's primary outputs.

SUMMARY OF THE INVENTION

In accordance with the present invention, a method of identifying untestable faults in a logic circuit is provided. Specifically, a lead in the circuit is selected and the circuit is analyzed to determine which faults would be hypothetically untestable if the selected circuit lead were unable to assume a first value (e.g., a logic 0), and which faults would be hypothetically untestable if the selected circuit lead were unable to assume a second value (e.g., a logic 1). Then, faults that would be untestable in both hypothetical cases are identified as untestable faults.

The selected circuit lead may, for example, be a circuit line stem (e.g., a fanout point) or a reconvergent input of a reconvergent circuit element (e.g., gate). Advantageously, the method of the present invention may be repeated for each such circuit line stem and each such reconvergent input of a reconvergent gate in order to identify most, if not all, of the untestable faults for the given logic circuit.

In accordance with one embodiment of the present invention, the faults which would be hypothetically untestable if the selected lead were unable to assume a given one of the first and second values may be determined based on an implication procedure. This implication procedure comprises the forward propagation of uncontrollability indicators and the backward propagation of unobservability indicators. In particular, an uncontrollability indicator for the given (first or second) value is assigned to the selected circuit lead and is propagated forward through the circuit according to a set of well-defined propagation rules. In addition, unobservability indicators are generated in the circuit based on the uncontrollability indicators and these unobservability indicators are then propagated backward through the circuit, also in accordance with a set of well-defined propagation rules. The hypothetically untestable faults are then determined based on the resultant indicators and their corresponding circuit leads.

In accordance with another embodiment of the present invention,, untestable faults may be identified in sequential (as opposed to combinational) circuits by generating from the sequential circuit a combinational iterative array circuit model for a predetermined number of time frames. The method of the instant invention may then be applied to the combinational iterative array circuit model. Faults in the sequential circuit which correspond to those in the combinational iterative array circuit model that would be untestable in both hypothetical cases and, which are located in the last (i.e., latest-in-time) time frame are identified as untestable faults of the original sequential circuit.

DETAILED DESCRIPTION

Figure 1:
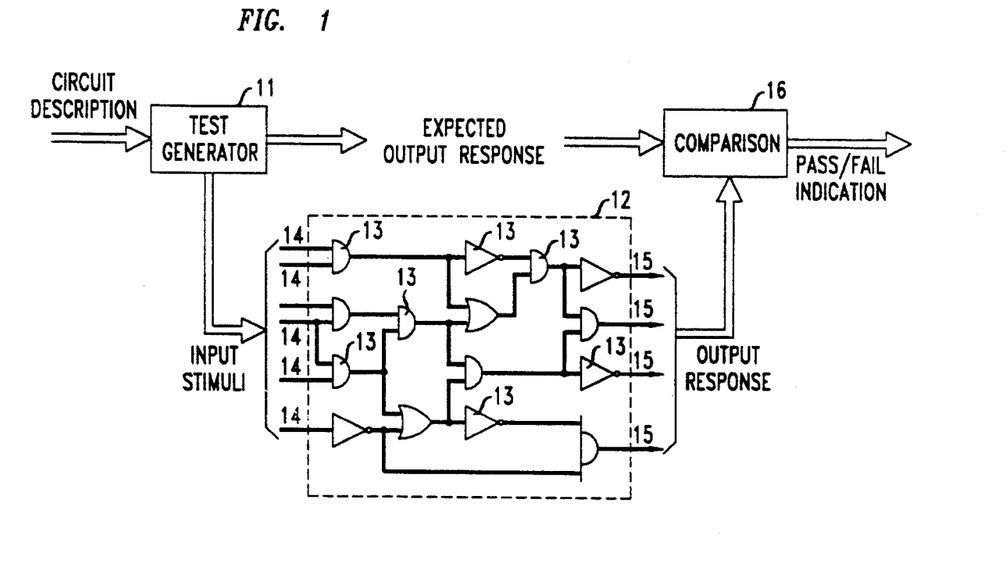
FIG. 1 shows an illustrative testing process for a logic circuit, the test having been generated an illustrative embodiment of the method of the present invention.

FIG. 1 shows an illustrative testing process for a logic circuit, the test having been generated by an illustrative embodiment of the method of the present invention. In particular, test generator 11 generates input stimuli and a corresponding expected output response based on a circuit description of the circuit to be tested. Specifically, test generator 11 operates in accordance with an illustrative embodiment of the method of the present invention, as shown, for example, in FIG. 3, below. Test generator 11 may, for example, comprise a general purpose computer system and software executing thereon. Each fabricated instance of circuit 12 comprises a plurality of interconnected circuit elements 13 (e.g., gates), one or more primary inputs 14 and one or more primary outputs 15.

When a given fabricated instance of circuit 12 is to be tested, the input stimuli generated by test generator 11 is applied to primary inputs 14 of circuit 12, and the resultant output response is measured on primary outputs 15. The resultant output response is compared with the expected output response (which was generated by test generator 11) by comparison circuit 16, thereby identifying faulty instances of the circuit. The testing process described herein is most commonly performed by a computer-controlled system known generically as Automatic Test Equipment (ATE). A typical ATE system comprises hardware components (in addition to the controlling computer) which are adapted to apply stimuli to a fabricated instance of a circuit, measure the responses from the fabricated instance of the circuit, and compare the measured response to a predetermined expected response. The fabricated instance of the circuit to be tested is usually "plugged into" the ATE system by means of a standardized interface.

Figure 2:
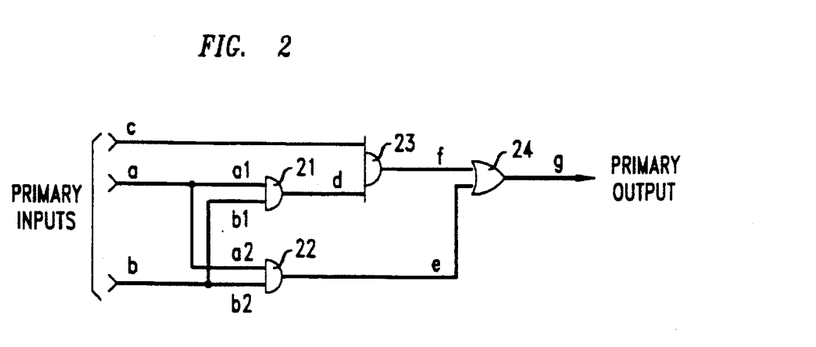
FIG. 2 illustrates an example combinational circuit to which an illustrative embodiment of the method of the present invention may be advantageously applied.

FIG. 2 illustrates an example combinational circuit to which an illustrative embodiment of the method of the present invention may be applied. The example circuit comprises "And" gates 21, 22 and 23 and "Or" gate 24 interconnected to each other and to primary inputs a, b and c and to primary output g. Consider the fault f stuck-at-0, where the first input lead to "Or" gate 24 is permanently fixed to a logic 0 value. (Note that in a case such as this where a circuit line contains no fanout, there is no meaningful distinction between a stuck-at fault at the output lead of the driving gate and the corresponding stuck-at fault at the input lead of the receiving gate.)

In order to detect (i.e., test for) a stuck-at fault (e.g., a stuck-at-0) at a given circuit lead, it is necessary that the given lead be "activated" to create a difference in value (e.g., 0 vs. 1) between the faulty circuit and the properly operational circuit, and, furthermore, that the resultant difference in value be "propagated" to a primary output of the circuit where it can be observed by the testing process. In order to activate a stuck-at fault on a given circuit lead, it is merely necessary to set the circuit lead to a logic value opposite to the stuck-at value. For example, the lead must be set to a logic 1 in order to detect a stuck-at-0 fault. In order to propagate a fault, a path from the given circuit lead to a primary output must be "sensitized"—that is, each gate along such a path must become sensitive to the value on the given path. This is achieved by setting the values on all of the other inputs of these gates to appropriate values. (For example, to sensitize the path from an input of either a "Nand" or "And" gate to its output, all of the other inputs must be set to logic 1 values.)

Thus, in order to detect the fault f stuck-at-0, it is first necessary that circuit leads c and d be set to a logic 1, and, by implication, it is necessary that both circuit leads a and b be set to a logic 1. However, in order to propagate the f stuck-at-0 fault effect from f to a primary output, circuit lead e must be set to a logic 0 (since only when lead e is a logic 0 will "Or" gate 24 be sensitized to allow the logic value on lead f to propagate to primary output g). Thus, by implication, at least one of circuit leads a and b must be set to a logic 0! This contradiction (i.e., both circuit leads a and b are set to a logic 1 vs. at least one of circuit leads a and b must be set to a logic 0) shows that the fault f stuck-at-0 is necessarily untestable. In other words, in order to detect the fault f stuck-at-0, it is necessary that one of circuit leads a or b be simultaneously a logic 0 and a logic 1.

The above analysis consisted of a procedure similar to that typically performed by ATG systems. By attempting to devise a test for the fault f stuck-at-0, a conflict arose which could not be resolved. In more typical (i.e., more complex) circuits, such conflicts are often encountered, but are often resolvable by backtracking to points at which arbitrary decisions (i.e., choices) were made, and making an alternate decision at that point. (For example, the output of a "Nand" gate may be set to a logic 1 by setting any of its inputs to a logic 0.) In the case of the above analysis for the fault f stuck-at-0 in the example circuit of FIG. 2, there were no choices which could have been made in an alternative manner, and, thus, no backtracking was possible.

Figure 3:
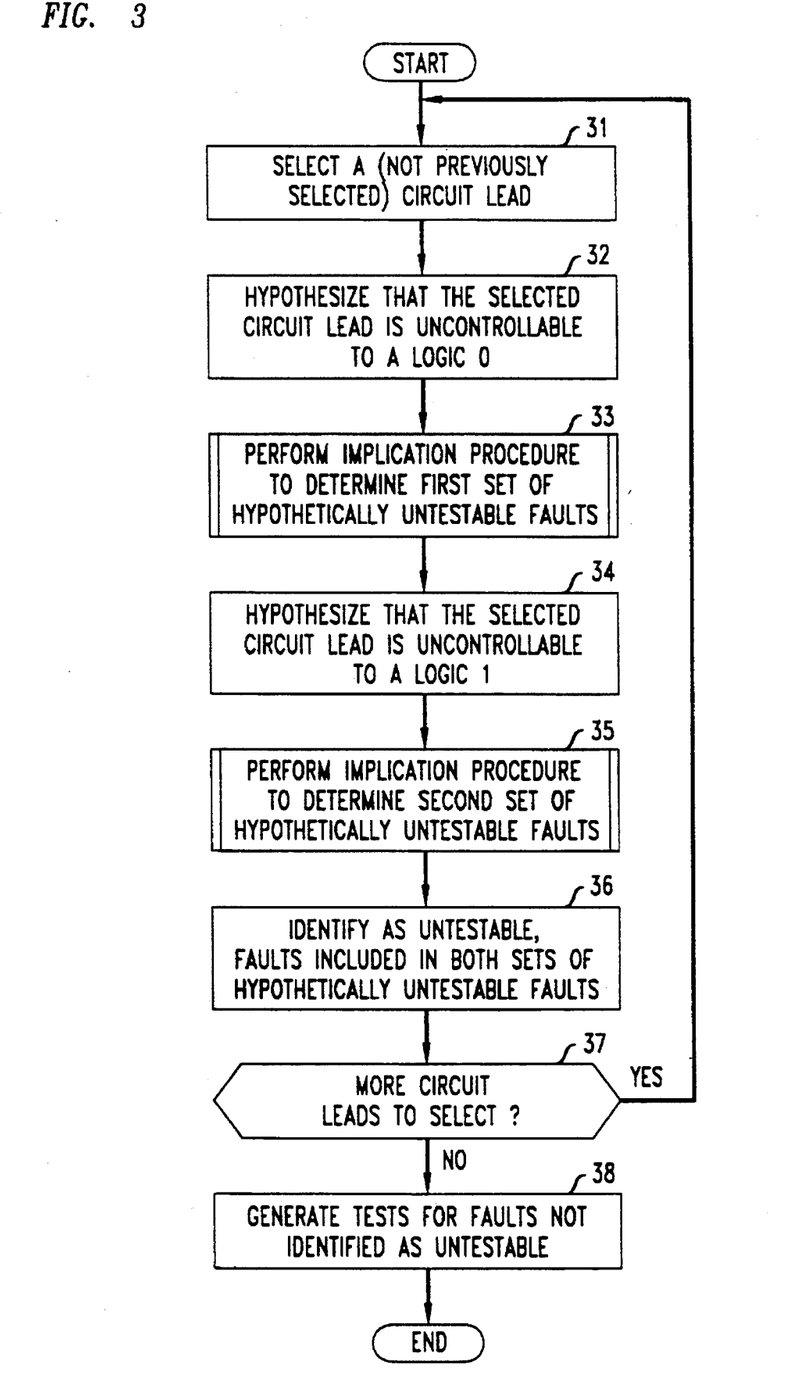
FIG. 3 shows a flowchart describing an illustrative embodiment of the method of the present invention for use with combinational circuits.
Figure 4A:
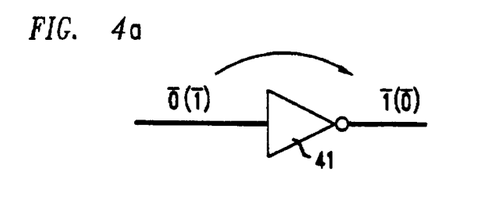
FIG. 4 shows selected illustrative rules for forward propagation of uncontrollability indicators and generation and backward propagation of unobservability indicators.
Figure 4B:
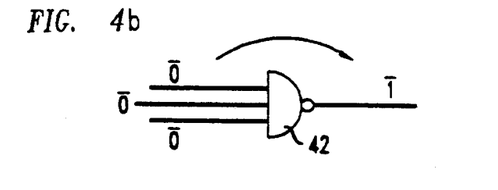
Figure 4C:
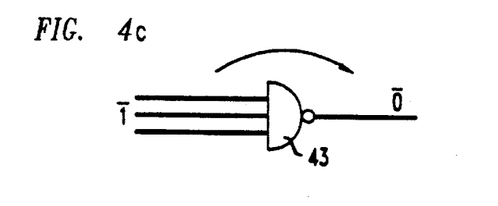
Figure 4D:
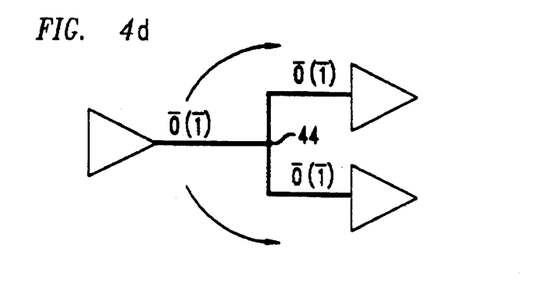
Figure 4E:
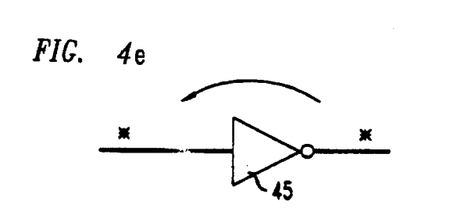
Figure 4F:
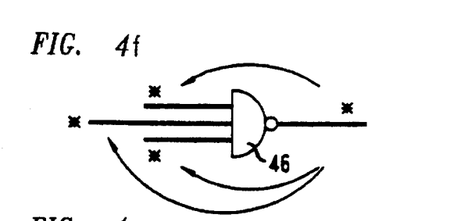
Figure 4G:
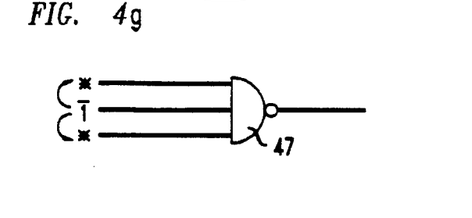

FIG. 3 shows a flowchart describing an illustrative embodiment of the method of the present invention for use with combinational circuits such as the example circuit of FIG. 2. The illustrative procedure iteratively selects each of a plurality of the circuit leads in the circuit in turn. The procedure begins in step 31 by selecting one such (not previously selected) circuit lead for analysis. Advantageously, the selected leads may be limited to stems of circuit lines having reconvergent fanout (i.e., the outputs of gates which have fanout branches which proceed along paths that ultimately reconverge as inputs to another gate) and to reconvergent inputs of reconvergent gates, rather than selecting each and every circuit lead in the circuit in turn. This advantage results from the fact that conflicts which cause untestable faults can only result frown reconvergent fanout structures. In one illustrative embodiment of method of the present invention, the selected leads are limited to only circuit line stems. By so limiting the selected leads, the technique of the present invention may well fail to identify some of the untestable faults in a given circuit. Nonetheless, such a limited approach typically identifies most of the untestable faults which would be identified by including the analysis of reconvergent inputs, while a significant reduction in computation time is achieved by analyzing only circuit line stems.

Once a given circuit lead is selected, step 32 of the illustrative procedure of FIG. 3 "marks" that circuit lead as being (hypothetically) uncontrollable to a logic 0 (i.e., unable to assume a logic 0 value, regardless of the values applied to the primary inputs of the circuit). Then, in step 33, an implication procedure is applied which marks other circuit nodes as uncontrollable to an appropriate logic value or unobservable (i.e., unable to have its value propagated to a primary output) as appropriate by implication from the originally hypothesized uncontrollability condition. Based on the resultant uncontrollability and unobservability indicators, a first set of hypothetically untestable faults may be deduced. (See discussion of the implication rules shown in FIG. 4 and discussion of the implication procedure of FIG. 5 below.)

Next, step 34 marks the selected circuit lead as being (hypothetically) uncontrollable to a logic 1 (i.e., unable to assume a logic 1 value). Then, in step 35, the implication procedure is again applied, thereby marking other circuit nodes as uncontrollable to an appropriate logic value or unobservable as appropriate by implication from the originally hypothesized uncontrollability condition. Based on this set of resultant uncontrollability and unobservability indicators, a second set of hypothetically untestable faults may be deduced.

Thus, two sets of hypothetically untestable faults have been deduced—a first set of faults each of which would be untestable if the selected circuit lead were uncontrollable to a logic 0, and a second set of faults each of which would be untestable if the selected circuit lead were uncontrollable to a logic 1. Since at any given point in time the selected circuit lead may only assume one of the two possible logic values, any fault which appears in both sets is necessarily untestable. The untestable faults which may be deduced based on the analysis of the selected circuit lead are identified in step 36 as those faults appearing in both sets. Decision 37 then determines if there are more circuit leads to select (i.e., whether all stems of circuit lines having reconvergent fanout and all reconvergent inputs of reconvergent gates have been analyzed) and repeats the above described procedure if there are more such leads to be analyzed. If there are no more circuit leads to analyze, step 38 performs the automatic test generation (ATG) process on the circuit, explicitly excluding those faults which have been identified as untestable by the procedure of steps 31 through 37. As described above, the ATG process of step 38 produces circuit stimuli and expected output responses.

FIG. 4 shows certain illustrative rules for forward propagation of uncontrollability indicators and backward propagation of unobservability indicators. These rules may be used by the illustrative implication procedure used in the procedure of FIG. 3 and shown in more detail in FIG. 5. Gates 41, 42 and 43 and circuit line fanout point 44 illustrate rules for forward propagation of uncontrollability indicators, and gates 45, 46 and 47 illustrate rules for backward propagation of unobservability indicators. By convention, "$\bar{0}$" will be used to denote the status of a circuit lead that is (hypothesized to be) uncontrollable to the logic value 0. Similarly, "$\bar{1}$" will be used to denote the status of a circuit lead that is (hypothesized to be) uncontrollable to the logic value 1. In addition, "*" will be used to denote the status of a circuit lead that is (hypothesized to be) unobservable.

Inverter gate 41, for example, shows that when an inverter gate's input is marked with a "$\bar{0}$," its output may be marked with a "$\bar{1}$." Similarly, when an inverter gate's input is marked with a "$\bar{1}$," its output may be marked with a "$\bar{0}$." These rules result from the obvious fact that if an inverter's input cannot be set to a given value, its output cannot be set to the opposite value. "Nand" gate 42 shows that when all of a "Nand" gate's inputs are marked with a "$\bar{0}$," its output may be marked with a "$\bar{1}$," since if none of a "Nand" gate's inputs can be set to a logic 0, there is no way to set its output to a logic 1. "Nand" gate 43 shows that when any of a "Nand" gate's inputs are marked with a "$\bar{1}$," its output may be marked with a "$\bar{0}$," since if any of a "Nand" gate's inputs cannot be set to a logic 1, there is no way to set its output to a logic 0. And fanout point 44 shows that when a circuit line stem is marked with a "$\bar{0}$," each of its fanout branches may be marked with a "$\bar{0}$," and, similarly, when a circuit line stem is marked with a "$\bar{1}$," each of its fanout branches may be marked with a "$\bar{1}$," since a fanout branch can only be set to a given value by setting its corresponding stem to that value. Similar rules for the forward propagation of uncontrollability indicators which may be applied to other gate types or circuit elements will be obvious to those of ordinary skill in the art.

Inverter gate 45 shows that when an inverter gate's output is marked with a "*," its input may also be marked with a "*." "Nand" gate 46 shows that when a "Nand" gate's output is marked with a "*," each of its inputs may be marked with a "*." These rules result from the fact that if any gate's output cannot be observed, none of its inputs can be observed. And "Nand" gate 47 shows that when one of its inputs is marked with a "$\bar{1}$," each of its other inputs may be marked with a "*," since an input to a "Nand" gate can only be observed by setting all of the other inputs to a logic 1. Similar rules for the backward propagation of unobservability indicators which may be applied to other gate types or circuit elements will also be obvious to those of ordinary skill in the art. (Note, however, that a circuit line stem can, in certain circumstances, be observable even if all of its fanout branches are not observable.)

Figure 5:
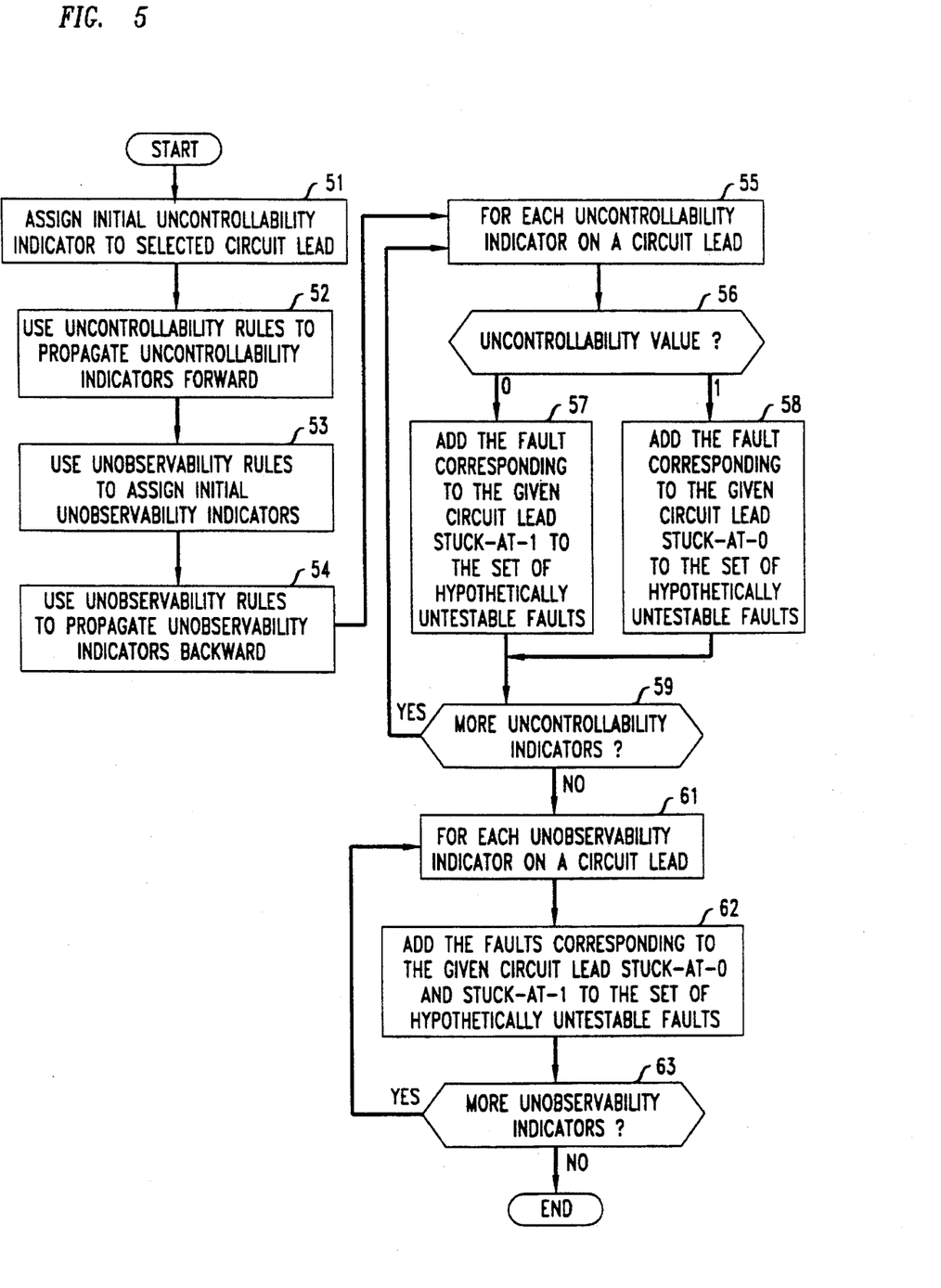
FIG. 5 shows a flowchart of an illustrative implication procedure for use in the illustrative procedure of FIG. 3.

FIG. 5 shows a flowchart of an illustrative implication procedure for use in steps 33 and 35 of the illustrative procedure of FIG. 3. Specifically, the procedure of FIG. 5 determines a set of faults that would (hypothetically) be untestable if a given, selected circuit lead were uncontrollable to a specified value. This illustrative procedure may, for example, use propagation rules such as those shown in FIG. 4 and described above.

Step 51 assigns an initial uncontrollability indicator to the selected circuit lead. This uncontrollability indicator marks the selected lead as uncontrollable to the specified logic value (0 or 1) depending on whether the procedure is being used to implement step 33 or step 35 of the procedure of FIG. 3. Next, step 52 uses predetermined uncontrollability indicator propagation rules (such as those shown on gates 41, 42 and 43 and circuit line fanout point 44 in FIG. 4) to propagate uncontrollability indicators forward through the circuit. Step 53 uses predetermined unobservability indicator creation rules (such as that shown on gate 47 in FIG. 4) to assign initial unobservability indicators to appropriate circuit leads. Step 54 then uses predetermined unobservability indicator propagation rules (such as those shown on gates 45 and 46 in FIG. 4) to propagate unobservability indicators backward through the circuit.

At this point, all circuit leads which can be implied to be uncontrollable and/or unobservable from the initial uncontrollability assumption (based on the predetermined set of rules) have been so marked. Thus it only remains to deduce the hypothetically untestable faults which result from the markings appearing on the various circuit leads. In particular, these are the faults that cannot be activated and the faults that cannot be propagated. The faults which (hypothetically) cannot be activated are the stuck-at-0 faults on leads which have been marked as uncontrollable to a logic 1 and the stuck-at-1 faults on leads which have been marked as uncontrollable to a logic 0. The faults which (hypothetically) cannot be propagated are both the stuck-at-0 and the stuck-at-1 faults on leads which have been marked as unobservable.

Thus, step 55 of the procedure of FIG. 5 chooses each circuit lead which has been marked with an uncontrollability indicator and, depending on the uncontrollability value with which it has been marked (as determined by decision 56), either the stuck-at-1 fault on that circuit lead (step 57) or the stuck-at-0 fault on that circuit lead (step 58) is added to the set of hypothetically untestable faults. Decision 59 returns to step 55 to choose another such circuit lead until each uncontrollabilty indicator has been processed.

Similarly, step 61 chooses each circuit lead which has been marked with an unobservability indicator, and step 62 adds both the stuck-at-0 fault and the stuck-at-1 fault on that circuit lead to the set of hypothetically untestable faults. Decision 63 returns to step 61 to choose another such circuit lead until each unobservability indicator has been processed.

Figure 6:
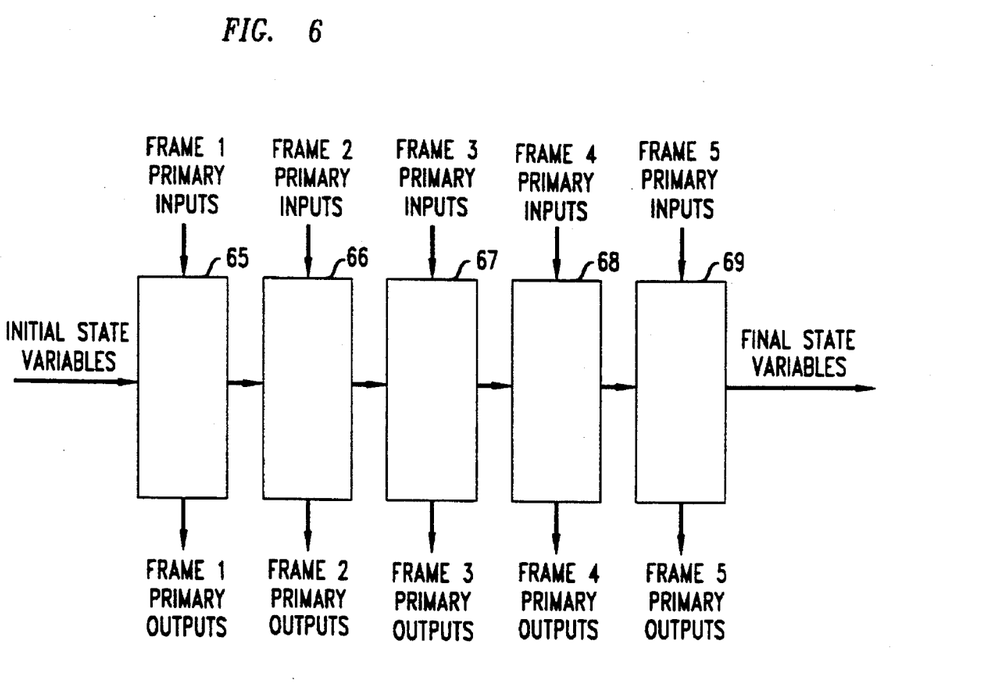
FIG. 6 shows an illustrative combinational iterative array circuit model of a sequential circuit to which an illustrative embodiment of the method of the present invention may be applied.

FIG. 6 shows an illustrative combinational iterative array circuit model of a sequential circuit to which an illustrative embodiment of the method of the present invention may be applied. It is well known to one of ordinary skill in the art that a sequential circuit may be transformed into an "equivalent" combinational circuit by use of a conventional combinational iterative array model. The combinational iterative array is obtained by expanding the sequential circuit into a (theoretically) infinite number of blocks, each of which is an identical combinational circuit (i.e., the combinational portion of the original sequential circuit). Each block represents the state of the circuit as it exists at a different time. That is, each block represents a distinct time frame, each one subsequent in time to the previous one. Since any practical test of a sequential circuit must contain a finite sequence of input stimuli (and thus involve a finite number of time frames), the combinational iterative array circuit model may be limited to a fixed (i.e., finite) number of frames.

FIG. 6, for example, shows the expansion of a sequential circuit into five (identical) combinational circuit blocks 65, 66, 67, 68 and 69. The primary inputs to each block are shown above and the primary outputs from each block are shown below the corresponding block. The left input of each block represents the present state variables (for the corresponding time frame) and the right output of each block corresponds to the next state variables (for use as the present state variables by the next time frame). The state variable inputs of the left-most (earliest-in-time) block (e.g., block 65 in FIG. 6) are considered fully controllable (as are the primary inputs of each time frame) and the state variable outputs of the right-most (latest-in-time) block (e.g., block 69 in FIG. 6) are considered fully observable (as are the primary outputs of each time frame).

It is known to those skilled in the art that any stuck-at fault in the right-most block of a (finite) combinational iterative array circuit model of a sequential circuit that is untestable is also untestable in the original sequential circuit. (See, e.g., V. D. Agrawal and S. T. Chakradhar, "Combinational ATPG Theorems for Identifying Untestable Faults in Sequential Circuits," Proc. European Test Conf., pp. 249–253, April 1993.) Thus, in accordance with one illustrative embodiment of the method of the present invention, untestable faults may be identified in a sequential circuit by first converting the sequential circuit to an equivalent combinational iterative array circuit model comprising a predetermined number of time frames, and then performing the above described procedure (e.g., the procedure of FIG. 3) for identifying untestable faults on the resultant combinational iterative array circuit. However, only faults in the latest-in-time time frame of the combinational iterative array circuit model are identified as untestable. Then, the faults in the original sequential circuit which correspond to these identified faults (i.e., the corresponding stuck-at fault on the corresponding circuit lead) are identified as untestable faults of the original sequential circuit.

Figure 7:
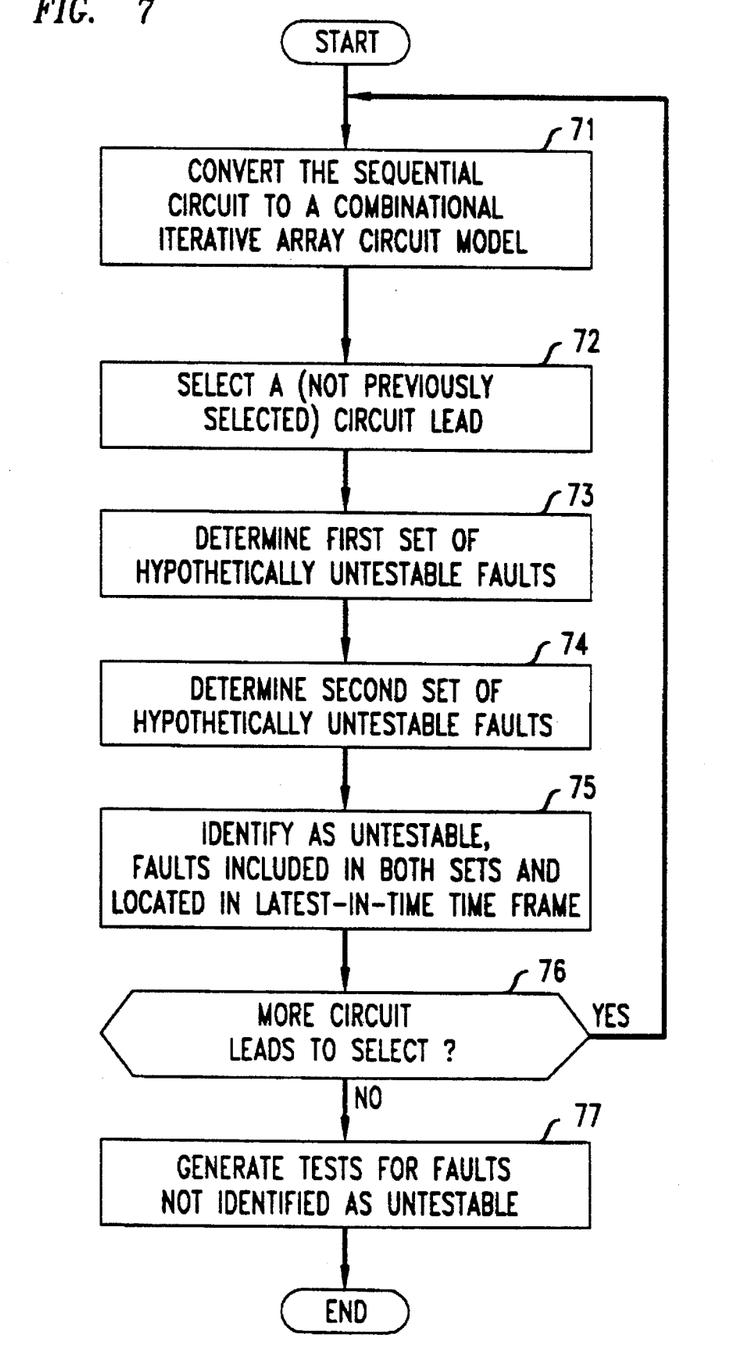
FIG. 7 shows a flowchart describing an illustrative embodiment of the method of the present invention for use with sequential circuits.

FIG. 7 shows a flowchart describing an illustrative embodiment of the method of the present invention for use with sequential circuits. First, step 71 converts the given sequential circuit to a combinational iterative array circuit model having a predetermined number of time frames, using conventional techniques. The predetermined number of time frames may be fixed at a constant value (e.g., five), or, in alternative embodiments, this number could be gradually increased while new untestable faults are found or until a predefined maximum value (e.g., five) is reached.

Given the combinational iterative array circuit model so created, step 72 selects a (not previously selected) circuit lead. This circuit lead may be located in any one of the time frames of the combinational iterative array circuit model. (The circuit leads in the different time frames are treated as different circuit leads—that is, each of these different leads is selected in turn.) Step 73 determines a first set of faults of the combinational iterative array circuit model which would be (hypothetically) untestable if the selected circuit lead were uncontrollable to a logic 0 value, and step 74 determines a second set of faults which would be (hypothetically) untestable if the selected circuit lead were uncontrollable to a logic 1 value. Step 75 then identifies as untestable (the faults in the sequential circuit which correspond to) the faults which are, included in both the first and second sets of hypothetically untestable faults and which are located in the latest-in-time time frame of the combinational iterative array circuit model. Decision 76 determines if there are more circuit leads to select, and, finally, step 77 performs the automatic test generation (ATG) process on the original sequential circuit, explicitly excluding those faults which have been identified as untestable by the procedure of steps 71 through 76.

Figure 8:
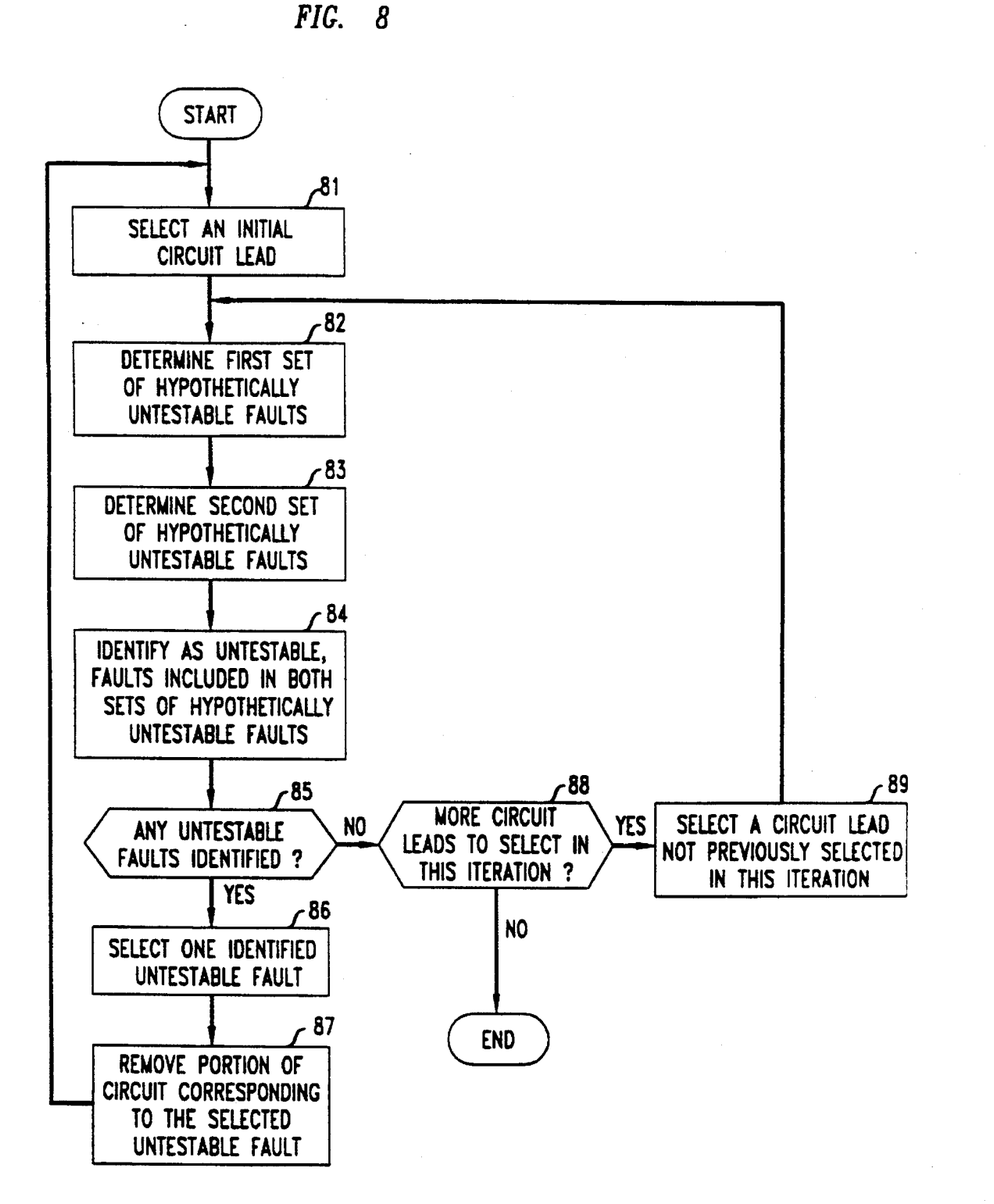
FIG. 8 shows a flowchart describing an additional illustrative embodiment of the method of the present invention wherein redundancy may be eliminated from a combinational circuit.

FIG. 8 shows a flowchart describing an additional illustrative embodiment of the method of the present invention wherein redundancy may be eliminated from a combinational circuit. Specifically, it is well known to one of ordinary skill in the art that an untestable fault in a combinational circuit necessarily implies the presence of logic redundancy in the circuit design. That is, by identifying an untestable fault in a combinational circuit, a corresponding portion of the circuit can be removed from the design without affecting the logical behavior of the circuit. Thus, in accordance with one illustrative embodiment of the method of the present invention, a combinational circuit may be simplified by iteratively identifying untestable faults and reducing the circuit design in accordance therewith. The resultant circuit will be smaller, but logically equivalent to, the original circuit. (Note that such a circuit reduction should advantageously be performed based on one identified untestable fault at a time, due to the fact that the removal of a portion of the circuit based on an untestable fault can affect the testability of other faults in the circuit.)

The illustrative redundancy elimination procedure of FIG. 8 identifies one untestable fault (at a time), removes the redundant portion of the circuit implied by the untestability of that fault, and then iterates this process until no more untestable faults are identified. Specifically, step 81 first selects for analysis an initial circuit lead from the given (current) version of the circuit, thereby beginning a given iteration of the redundancy elimination procedure. Step 82 determines a first set of hypothetically untestable faults based on the assumption that the selected circuit lead could not, for example, be controlled to a logic 0. Similarly, step 82 determines a second set of hypothetically untestable faults based on the assumption that the selected circuit lead could not, for example, be controlled to a logic 1. Step 84 then identifies as untestable, faults included in both sets of hypothetically untestable faults.

Decision 85 determines whether any faults have been identified as untestable in step 84, and if so, step 86 selects any one of these identified untestable faults. Step 87 then removes the portion of the circuit which can be determined to be redundant based on the untestability of the selected fault. For example, if a stuck-at-0 fault on a given circuit lead is an untestable fault, then all circuitry which feeds into the given circuit lead may be removed (to the extent that it does not feed into any other circuit leads which are not being removed), and the given circuit lead may be affixed to a logic 0 value (e.g., tied to ground). The selection of an untestable fault in step 86 may be made arbitrarily, or it may advantageously be based on the portion of the circuit that would be removed in step 87 based on its selection. (For example, untestable faults could advantageously be selected based on the quantity of circuitry that their selection would cause to be removed. In this manner, the efficiency of the redundancy elimination procedure may be improved.) After step 87 has removed the redundant circuitry, a new iteration of the redundancy elimination procedure begins by returning to step 81. The new iteration will use the new version of the circuit as its current version.

If decision 85 determines that no faults have been identified in step 84, decision 88 determines whether there are more circuit leads to be analyzed (i.e., selected) within the given iteration (i.e., since the circuit was modified by step 87). If so, step 89 selects a circuit lead which has not yet been selected within the given iteration and returns to step 82 in a further attempt to identify untestable faults in the current version of the circuit. If decision 88 determines that there are no more circuit leads to be analyzed within the given iteration, then an entire iteration of the procedure has been performed without identifying any untestable faults— that is, no untestable faults have been found in the current version of the circuit. Thus, the redundancy elimination procedure of FIG. 8 terminates, and the final version of the circuit may be adopted as logically equivalent to the original circuit design.

Although a number of specific embodiments of this invention have been shown and described herein, it is to be understood that these embodiments are merely illustrative of the many possible specific arrangements which can be devised in application of the principles of the invention. Numerous and varied other arrangements can be devised in accordance with these principles by those of ordinary skill in the art without departing from the spirit and scope of the invention. For example, although the above embodiments have been limited to logic circuits which operate based on a two-valued (binary) system comprising the values of logic 0 and logic 1, other embodiments may use logic systems based on three (ternary logic) or more values. In addition, techniques other than the implication procedure of FIG. 5 described above may be used to determine the set of faults which would be untestable if a given circuit lead were hypothetically uncontrollable to a given logic value.

We claim:

1. A method of identifying untestable faults in a model of a logic circuit, the model of the logic circuit comprising a plurality of circuit elements each having one or more circuit leads and a plurality of circuit lines interconnecting the circuit leads of the circuit elements, each of the circuit leads able to assume one of a predetermined plurality of logic values, the method comprising the steps of:

selecting one of the circuit leads of the model;

determining a first set of faults, the first set of faults comprising faults which would be untestable if the selected circuit lead were unable to assume a first one of the predetermined plurality of logic values;

determining a second set of faults, the second set of faults comprising faults which would be untestable if the selected circuit lead were unable to assume a second one of the predetermined plurality of logic values; and identifying as untestable faults one or more faults included both in the first set of faults and in the second set of faults.

2. The method of claim 1 wherein the selected circuit lead comprises a stem of a circuit line having reconvergent fanout.

3. The method of claim 1 wherein the selected circuit lead comprises a reconvergent input of a reconvergent circuit element.

4. The method of claim 1 wherein the logic circuit comprises a combinational logic circuit.

5. The method of claim 1 wherein:

the model of the logic circuit comprises a combinational iterative array circuit model of a sequential logic circuit, the combinational iterative array circuit model comprising a predetermined number of time frames;

the selected circuit lead is selected from one of the time frames of the combinational iterative array circuit model; and the first set of faults and the second set of faults each comprises faults in the latest-in-time time frame of the combinational iterative array circuit model.

6. The method of claim 1 wherein the step of determining the first set of faults corresponding to the first logic value and the step of determining the second set of faults corresponding to the second logic value each comprises an implication procedure, the implication procedure comprising the steps of:

assigning to the selected circuit lead an initial uncontrollability indicator, the initial uncontrollability indicator hypothesizing that the selected circuit lead cannot assume the corresponding one of the first logic value and the second logic value;

assigning uncontrollability indicators to circuit leads other than the selected circuit lead by propagating the initial uncontrollability indicator forward through the logic circuit according to a set of propagation rules;

assigning initial unobservability indicators to circuit leads based on the assigned uncontrollability indicators, the unobservability indicators hypothesizing that the value assumed by the corresponding circuit lead cannot be observed;

assigning additional unobservability indicators to circuit leads by propagating unobservability indicators backward through the logic circuit according to a set of propagation rules; and determining the set of faults based on the uncontrollability indicators and the unobservability indicators and their corresponding circuit leads.

7. The method of claim 6 wherein:

the model of the logic circuit comprises a combinational iterative array circuit model of a sequential logic circuit, the combinational iterative array circuit model comprising a predetermined number of time frames;

the selected circuit lead is selected from one of the time frames of the combinational iterative array circuit model; and the step of determining the set of faults determines the faults based on the uncontrollability indicators and the unobservability indicators and their corresponding circuit leads, wherein the corresponding circuit leads are located in the latest-in-time time frame of the combinational iterative array circuit model.

8. An automated method of generating a test for a logic circuit based on a model of the logic circuit, the model of the logic circuit comprising a plurality of circuit elements each having one or more circuit leads and a plurality of circuit lines interconnecting the circuit leads of the circuit elements, each of the circuit leads able to assume one of a predetermined plurality of logic values, the method comprising the steps of:

selecting one of the circuit leads of the model;

determining a first set of faults, the first set of faults comprising faults which would be untestable if the selected circuit lead were unable to assume a first one of the predetermined plurality of logic values;

determining a second set of faults, the second set of faults comprising faults which would be untestable if the selected circuit lead were unable to assume a second one of the predetermined plurality of logic values;

identifying as untestable faults one or more faults included both in the first set of faults and in the second set of faults; and generating the test based on one or more faults which have not been identified as untestable faults.

9. The method of claim 8 wherein the selected circuit lead comprises a stem of a circuit line having reconvergent fanout.

10. The method of claim 8 wherein the selected circuit lead comprises a reconvergent input of a reconvergent circuit element.

11. The method of claim 8 wherein the logic circuit comprises a combinational logic circuit.

12. The method of claim 8 wherein:

the model of the logic circuit comprises a combinational iterative array circuit model of a sequential logic circuit, the combinational iterative array circuit model comprising a predetermined number of time frames;

the selected circuit lead is selected from one of the time frames of the combinational iterative array circuit model; and the first set of faults and the second set of faults each comprises faults in the latest in-time time frame of the combinational iterative array circuit model.

13. The method of claim 8 wherein the step of determining the first set of faults corresponding to the first logic value and the step of determining the second set of faults corresponding to the second logic value each comprises an implication procedure, the implication procedure comprising the steps of:

assigning to the selected circuit lead an initial uncontrollability indicator, the initial uncontrollability indicator hypothesizing that the selected circuit lead cannot assume the corresponding one of the first logic value and the second logic value;

assigning uncontrollability indicators to circuit leads other than the selected circuit lead by propagating the initial uncontrollability indicator forward through the logic circuit according to a set of propagation rules;

assigning initial unobservability indicators to circuit leads based on the assigned uncontrollability indicators, the unobservability indicators hypothesizing that the value assumed by the corresponding circuit lead cannot be observed;

assigning additional unobservability indicators to circuit leads by propagating unobservability indicators backward through the logic circuit according to a set of propagation rules; and determining the set of faults based on the uncontrollability indicators and the unobservability indicators and their corresponding circuit leads.

14. The method of claim 13 wherein:

the model of the logic circuit comprises a combinational iterative array circuit model of a sequential logic circuit, the combinational iterative array circuit model comprising a predetermined number of time frames;

the selected circuit lead is selected from one of the time frames of the combinational iterative array circuit model; and the step of determining the set of faults determines the faults based on the uncontrollability indicators and the unobservability indicators and their corresponding circuit leads, wherein the corresponding circuit leads are located in the latest-in-time time frame of the combinational iterative array circuit model.

15. A method of testing a fabricated logic circuit with use of an automatically generated test, the test generated based on a model of the fabricated logic circuit, the test comprising a circuit stimulus and a corresponding expected circuit response, the model comprising a plurality of circuit elements each having one or more circuit leads and a plurality of circuit lines interconnecting the circuit leads of the circuit elements, each of the circuit leads able to assume one of a predetermined plurality of logic values, the method comprising the steps of:

selecting one of the circuit leads of the model;

determining a first set of faults, the first set of faults comprising faults which would be untestable if the selected circuit lead were unable to assume a first one of the predetermined plurality of logic values;

determining a second set of faults, the second set of faults comprising faults which would be untestable if the selected circuit lead were unable to assume a second one of the predetermined plurality of logic values;

identifying as untestable faults one or more faults included both in the first set of faults and in the second set of faults;

generating the test based on one or more faults which have not been identified as untestable faults;

applying the generated circuit stimulus to the fabricated logic circuit;

measuring a circuit response from the fabricated logic circuit; and determining whether the circuit response from the fabricated logic circuit differs from the generated expected circuit response corresponding to the generated circuit stimuli.

16. The method of claim 15 wherein:

the model of the fabricated logic circuit comprises a combinational array circuit model of a sequential logic circuit, the combinational array circuit model comprising a predetermined number of time frames;

the selected circuit lead is selected from one of the time frames of the combinational array circuit model; and the first set of faults and the second set of faults each comprises faults in the last time frame of the combinational array circuit model.

17. The method of claim 15 wherein the step of determining the first set of faults corresponding to the first logic value and the step of determining the second set of faults corresponding to the second logic value each comprises an implication procedure, the implication procedure comprising the steps of:

assigning to the selected circuit lead an initial uncontrollability indicator, the initial uncontrollability indicator hypothesizing that the selected circuit lead cannot assume the corresponding one of the first logic value and the second logic value;

assigning uncontrollability indicators to circuit leads other than the selected circuit lead by propagating the initial uncontrollability indicator forward through the logic circuit according to a set of propagation rules;

assigning initial unobservability indicators to circuit leads based on the assigned uncontrollability indicators, the unobservability indicators hypothesizing that the value assumed by the corresponding circuit lead cannot be observed:

assigning additional unobservability indicators to circuit leads by propagating unobservability indicators backward through the logic circuit according to a set of propagation rules; and determining the set of faults based on the uncontrollability indicators and the unobservability indicators and their corresponding circuit leads.

18. The method of claim 17 wherein:

the model of the fabricated logic circuit comprises a combinational array circuit model of a sequential logic circuit, the combinational array circuit model comprising a predetermined number of time frames;

the selected circuit lead is selected from one of the time frames of the combinational array circuit model; and the step of determining the set of faults determines the faults based on the uncontrollability indicators and the unobservability indicators and their corresponding circuit leads which are located in the last time frame of the combinational array circuit model.

19. A method of testing a fabricated logic circuit with use of an automatically generated test, the test based on a model of the fabricated logic circuit, the test comprising a circuit stimulus and a corresponding expected circuit response, the model comprising a plurality of circuit elements each having one or more circuit leads and a plurality of circuit lines interconnecting the circuit leads of the circuit elements, each of the circuit leads able to assume one of a predetermined plurality of logic values, the test having been generated by:

selecting one of the circuit leads of the model;

determining a first set of faults, the first set of faults comprising faults which would be untestable if the selected circuit lead were unable to assume a first one of the predetermined plurality of logic values;

determining a second set of faults, the second set of faults comprising faults which would be untestable if the selected circuit lead were unable to assume a second one of the predetermined plurality of logic values;

identifying as untestable faults one or more faults included both in the first set of faults and in the second set of faults; and generating the test based on one or more faults which have not been identified as untestable faults, the method comprising the steps of:

applying the generated circuit stimulus to the fabricated logic circuit;

measuring a circuit response from the fabricated logic circuit; and determining whether the circuit response from the fabricated logic circuit differs from the generated expected circuit response corresponding to the generated circuit stimuli.

20. The method of claim 19 wherein:

the model of the fabricated logic circuit comprises a combinational array circuit model of a sequential logic circuit, the combinational array circuit model comprising a predetermined number of time frames;

the selected circuit lead is selected from one of the time frames of the combinational array circuit model; and the first set of faults and the second set of faults each comprises faults in the last time frame of the combinational array circuit model.

21. The method of claim 19 wherein the step of determining the first set of faults corresponding to the first logic value and the step of determining the second set of faults corresponding to the second logic value each comprises an implication procedure, the implication procedure comprising the steps of:

assigning to the selected circuit lead an initial uncontrollability indicator, the initial uncontrollability indicator hypothesizing that the selected circuit lead cannot assume the corresponding one of the first logic value and the second logic value;

assigning uncontrollability indicators to circuit leads other than the selected circuit lead by propagating the initial uncontrollability indicator forward through the logic circuit according to a set of propagation rules;

assigning initial unobservability indicators to circuit leads based on the assigned uncontrollability indicators, the unobservability indicators hypothesizing that the value assumed by the corresponding circuit lead cannot be observed;

assigning additional unobservability indicators to circuit leads by propagating unobservability indicators backward through the logic circuit according to a set of propagation rules; and determining the set of faults based on the uncontrollability indicators and the unobservability indicators and their corresponding circuit leads.

22. The method of claim 21 wherein:

the model of the fabricated logic circuit comprises a combinational array circuit model of a sequential logic circuit, the combinational array circuit model comprising a predetermined number of time frames;

the selected circuit lead is selected from one of the time frames of the combinational array circuit model; and the step of determining the set of faults determines the faults based on the uncontrollability indicators and the unobservability indicators and their corresponding circuit leads which are located in the last time frame of the combinational array circuit model.

23. A method of modifying a logic circuit design to remove logical redundancy, the logic circuit design comprising a plurality of circuit elements each having one or more circuit leads and a plurality of circuit lines interconnecting the circuit leads of the circuit elements, each of the circuit leads able to assume one of a predetermined plurality of logic values, the method comprising the steps of:

selecting one of the circuit leads of the logic circuit design;

determining a first set of faults, the first set of faults comprising faults which would be untestable if the selected circuit lead were unable to assume a first one of the predetermined plurality of logic values;

determining a second set of faults, the second set of faults comprising faults which would be untestable if the selected circuit lead were unable to assume a second one of the predetermined plurality of logic values;

identifying as untestable faults one or more faults included both in the first set of faults and in the second set of faults;

selecting one of the identified untestable faults; and modifying the logic circuit design by removing a portion thereof, the removed portion determined based on the selected identified untestable fault.

24. The method of claim 23 wherein the selected circuit lead comprises a stem of a circuit line having reconvergent fanout.

25. The method of claim 23 wherein the selected circuit lead comprises a reconvergent input of a reconvergent circuit element.

26. The method of claim 23 wherein the step of determining the first set of faults corresponding to the first logic value and the step of determining the second set of faults corresponding to the second logic value each comprises an implication procedure, the implication procedure comprising the steps of:

assigning to the selected circuit lead an initial uncontrollability indicator, the initial uncontrollability indicator hypothesizing that the selected circuit lead cannot assume the corresponding one of the first logic value and the second logic value;

assigning uncontrollability indicators to circuit leads other than the selected circuit lead by propagating the initial uncontrollability indicator forward through the logic circuit according to a set of propagation rules;

assigning initial unobservability indicators to circuit leads based on the assigned uncontrollability indicators, the unobservability indicators hypothesizing that the value assumed by the corresponding circuit lead cannot be observed;

assigning additional unobservability indicators to circuit leads by propagating unobservability indicators backward through the logic circuit according to a set of propagation rules; and determining the set of faults based on the uncontrollability indicators and the unobservability indicators and their corresponding circuit leads.

* * * * *